US006326263B1

(12) United States Patent
Hsieh

(10) Patent No.: US 6,326,263 B1
(45) Date of Patent: Dec. 4, 2001

(54) METHOD OF FABRICATING A FLASH MEMORY CELL

(75) Inventor: Tsong-Minn Hsieh, Miao-Li (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/636,557

(22) Filed: Aug. 11, 2000

(51) Int. Cl.$^7$ .................................................. H01L 21/336
(52) U.S. Cl. .............................................. 438/257; 257/316
(58) Field of Search .................................. 438/257, 267; 257/316

(56) References Cited

U.S. PATENT DOCUMENTS

| | | | |
|---|---|---|---|
| 6,008,089 | * 12/1999 | Hong | 438/257 |
| 6,027,998 | * 2/2000 | Pham et al. | 438/257 |
| 6,054,350 | * 4/2000 | Hsieh et al. | 438/261 |
| 6,060,357 | * 5/2000 | Lee | 438/257 |
| 6,114,204 | * 9/2000 | Ding et al. | 438/257 |
| 6,166,409 | * 12/2000 | Ratnam et al. | 257/316 |
| 6,214,667 | * 4/2001 | Ding et al. | 438/257 |
| 6,245,614 | * 6/2001 | Hsieh | 438/267 |

FOREIGN PATENT DOCUMENTS

| | | | |
|---|---|---|---|
| 019646419C1 | * 11/1996 | (DE) | H01L/27/115 |
| 11-307744 | * 11/1999 | (JP) | H01L/27/10 |

* cited by examiner

Primary Examiner—Charles Bowers
Assistant Examiner—David S. Blum
(74) Attorney, Agent, or Firm—Winston Hsu

(57) ABSTRACT

A semiconductor wafer is provided having a substrate, and a tunneling oxide layer is formed thereon. A sacrificial layer defining an active region is formed over the tunneling oxide layer, and a defined first polysilicon layer is formed on the tunneling oxide layer within the active region and covered by the sacrificial layer. The process sequence includes: performing an etching process using the sacrificial layer as a mask to form a STI pattern, forming a dielectric layer that fills the STI pattern, performing a planarization process to remove the dielectric layer over the sacrificial layer, performing a first etch back process to remove a pre-selected thickness of the dielectric layer over the STI pattern, forming a second polysilicon layer, performing a second etch back process to form a spacer connecting with the first polysilicon layer, removing the sacrificial layer, forming an insulating layer on the surface of the spacer and the first polysilicon layer, forming a control gate on the insulating layer, and performing an ion implantation process to form a source and a drain on the substrate within the active region.

15 Claims, 7 Drawing Sheets

METHOD OF FABRICATING A FLASH MEMORY CELL

BACKGROUND OF THE INVENTION

1. Field of the Invention

The present invention relates to a method of fabricating a flash memory cell, and more particularly, to a method of fabricating a flash memory cell having a self-aligned floating gate structure and an enhanced coupling ratio characteristic.

2. Description of the Prior Art

EEPROM (electrically erasable programmable read only memory) is a very popular memory device used in the electronics industry because it can store data in a non-volatile manner for more than 10 years, and it can be reprogrammed or erased many times. But one of the drawbacks of EEPROM devices is that their memory access time is quite slow compared to other memory devices. In order to solve this problem, a flash EEPROM device, or flash memory, was developed by Intel. In contrast to traditional EEPROM, the flash memory can erase recorded data a block at a time instead of a byte at a time, and this dramatically increases the memory access time.

The flash memory technology achieves high density due to a smaller memory cell size realized in a stacked-gate memory cell profile. A stacked-gate flash memory cell comprises a floating gate for storing electric charge, a control gate for controlling the charging of the floating gate, and a dielectric layer positioned between the floating gate and the control gate. Like a capacitor, the flash memory stores electric charge in the floating gate to represent a digital data bit of "1", and removes charge from the floating gate to represent a digital data bit of "0".

Please refer to FIG. 1 to FIG. 7. FIG. 1 to FIG. 7 are cross-sectional diagrams illustrating the processes of fabricating a flash memory cell on a semiconductor wafer 10 according to the prior art method. As shown in FIG. 1, the semiconductor wafer 10 comprises a silicon substrate 12, a tunneling oxide layer 14 with a thickness of about 50 to 200 angstroms formed on the surface of the silicon substrate 12, and a defined polysilicon layer 16 with a thickness of 500 to 1000 angstroms on the tunneling oxide layer 14. The defined polysilicon layer 16 is formed within predetermined regions over the semiconductor wafer 10 using conventional lithographic and etching processes. These predetermined regions are known as active regions, and the defined polysilicon layer 16, which functions as a gate electrode, defines the channel of a field-effect-transistor (FET). First, a sacrificial layer 18, made of silicon nitride, is deposited on the surface of the semiconductor wafer 10, covering the defined polysilicon layer 16 and the tunneling layer 14. A developed and patterned photoresist layer 20 is then used to define the active regions 21 over the polysilicon layer 16 atop the sacrificial layer 18. The memory cell of an EEPROM is formed within each of the active regions 21.

As shown in FIG. 2, an anisotropic etching process is performed to etch the sacrificial layer 18 outside the active regions 21, which is not covered and protected by the patterned photoresist layer 20. Subsequently, a plasma ashing process and a series of cleaning processes are used to remove from the surface of the semiconductor wafer 10 the photoresist layer 20, residues and byproducts formed during the previous etching processes. As shown in FIG. 3, after defining the active regions 21 in the sacrificial layer 18, the semiconductor wafer 10 is subject to another dry etching process in which the defined sacrificial layer 18 acts as a hard mask. The silicon substrate 12 that is not covered by the sacrificial layer 18 is vertically etched in this etching process, thereby forming a shallow trench pattern 22 on the surface of the silicon substrate 12.

Next, as shown in FIG. 4, a high-density plasma chemical vapor 20 deposition (HDPCVD) process is performed to deposit an HDP oxide layer 24 that fills the trench pattern 22 on the surface of the semiconductor wafer 10. As shown in FIG. 5, using a chemical mechanical polishing (CMP) process, the HDP oxide layer 24 over the sacrificial layer 18 is removed, thus obtaining a planar topography that is beneficial to the following processes.

As shown in FIG. 6, using a wet etching process, such as hot phosphoric acid etching, the sacrificial layer 18 is completely removed and the top face of the polysilicon layer 16 is therefore exposed. A polysilicon layer 26 is then formed on the semiconductor wafer 10 using a conventional chemical vapor deposition method. Thereafter, a conventional lithographic process is performed to define the location of the floating gate over the polysilicon layer 26 and the polysilicon layer 16 by using a patterned photoresist layer 28.

In FIG. 7, using the patterned photoresist layer 28 as a etch mask, an etching process is performed to remove the polysilicon layer 26 that is not covered by the photoresist layer 28 down to the surface of the HDP oxide layer 24, thereby forming the floating gate 27. The floating gate consists of the polysilicon layer 26 and polysilicon layer 16. After removing the photoresist layer 28, a thin oxidized-silicon nitride-silicon oxide (ONO) dielectric layer 32 is formed on the exposed surface of the floating gate 27. Finally, a control gate of doped polysilicon 34 is formed over the ONO dielectric layer 32.

There are two weaknesses of the prior art method of fabricating a flash memory, which are as follows: (1) occurrences of misalignment when defining the floating gate 27 using the photoresist layer 28 increases as the line width shrinks, and (2) the coupling ratio of the flash memory cell according to the prior art method is insufficient for future requirements. Coupling ratio is an index that is usually used to evaluate the performance of a flash memory cell. The higher the coupling ratio, the better the performance of the flash memory cell. An inferior coupling ratio characteristic of the flash memory leads to undesirable higher reading currents, and higher programming and erasing voltages. Furthermore, the misalignment phenomenon reduces the yield of flash memory products.

SUMMARY OF THE INVENTION

It is therefore a primary objective of the present invention to provide a method of fabricating a flash memory cell having a self-aligned floating gate structure and a superior coupling ratio characteristic, and to provide a manufacturing process that can effectively enhance the performance of flash memory products.

In accordance with the objectives of the present invention, a new method of fabricating a high coupling ratio flash memory cell is disclosed. A semiconductor wafer is first provided having a substrate. A tunneling oxide layer is formed on the substrate. A sacrificial layer defining an active region is formed over the tunneling oxide layer, and a defined first polysilicon layer is formed on the tunneling oxide layer within the active region, covered by the sacrificial layer. Briefly, the process sequence includes: performing an etching process using the sacrificial layer as a mask to form a shallow trench isolation (STI) pattern on the substrate, forming a dielectric layer on the semiconductor wafer that fills the STI pattern, performing a planarization process to remove the dielectric layer over the sacrificial layer, performing a first etch back process to remove a pre-selected thickness of the dielectric layer over the STI pattern, forming a second polysilicon layer on the semiconductor wafer, performing a second etch back process to form a spacer connecting with the first polysilicon layer, removing the sacrificial layer, forming an insulating layer on the surface of the spacer and the first polysilicon layer, forming a control gate on the insulating layer, and performing an ion implantation process to form a source and a drain on the substrate within the active region.

According to the present invention, two polysilicon spacers connecting with the first polysilicon layer, acting as portions of the floating gate, are formed. The two spacers and the first polysilicon layer together form the self-aligned floating gate structure. The two spacers are formed using an anisotropic dry etching process so that the problem of misalignment is completely avoided. Moreover, a significant increase in the capacitive surface between the floating gate and the control gate is achieved due to the self-aligned floating structure, thus enhancing the coupling ratio of the flash memory cell.

These and other objectives of the present invention will no doubt become obvious to those of ordinary skill in the art after having read the following detailed description of the preferred embodiment, which is illustrated in the various figures and drawings.

DETAILED DESCRIPTION OF THE PREFERRED EMBODIMENT

Figure 1:
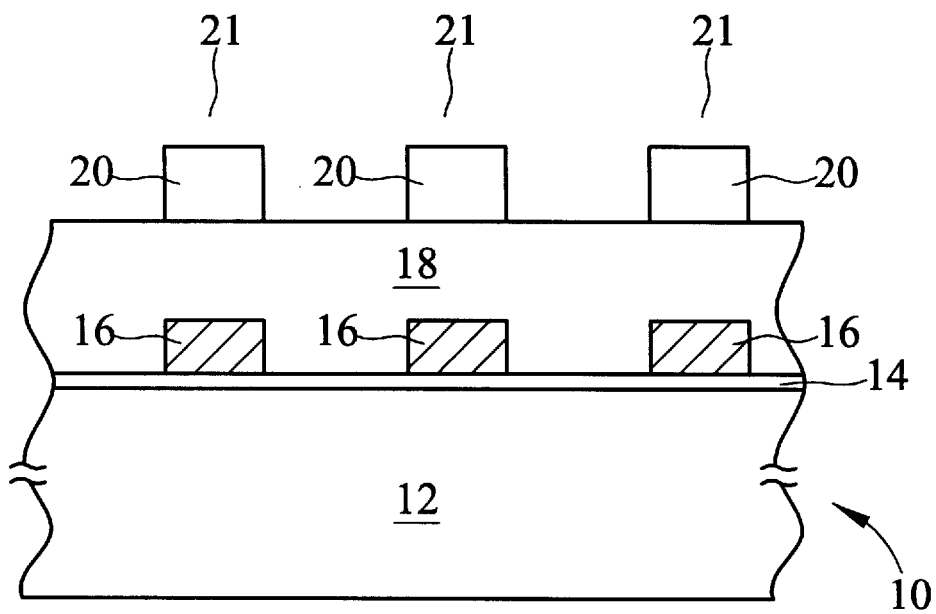
FIG. 1 to FIG. 7 are cross-sectional diagrams of forming a flash memory cell on a semiconductor wafer according to the prior art.
Figure 2:
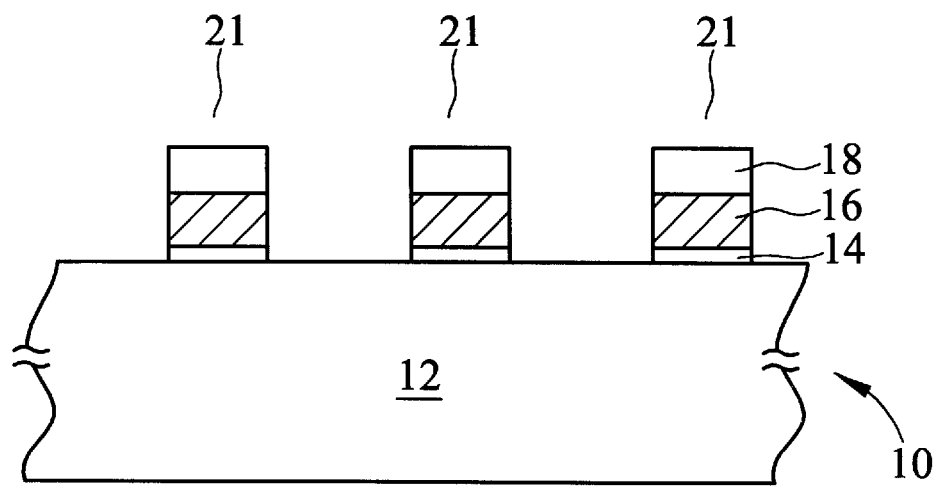
Figure 3:
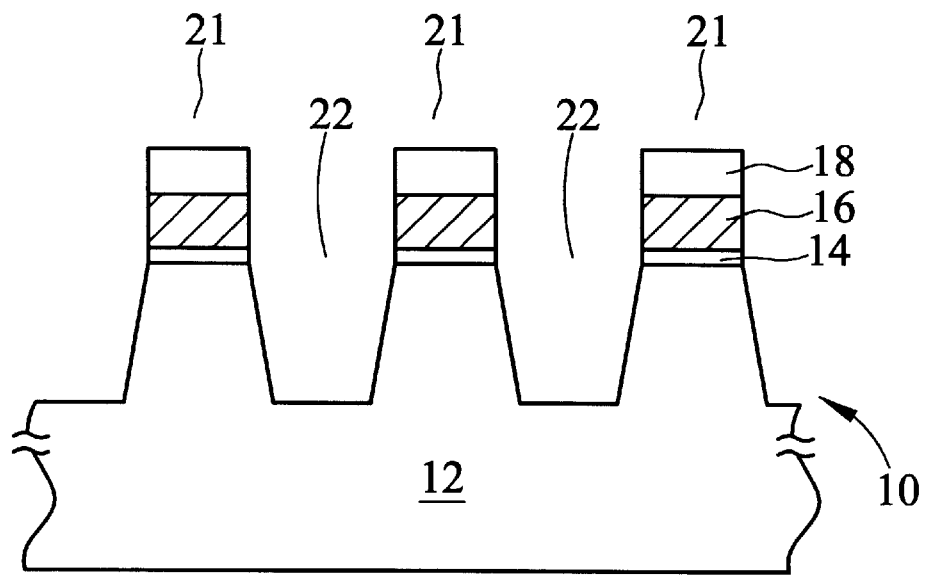
Figure 4:
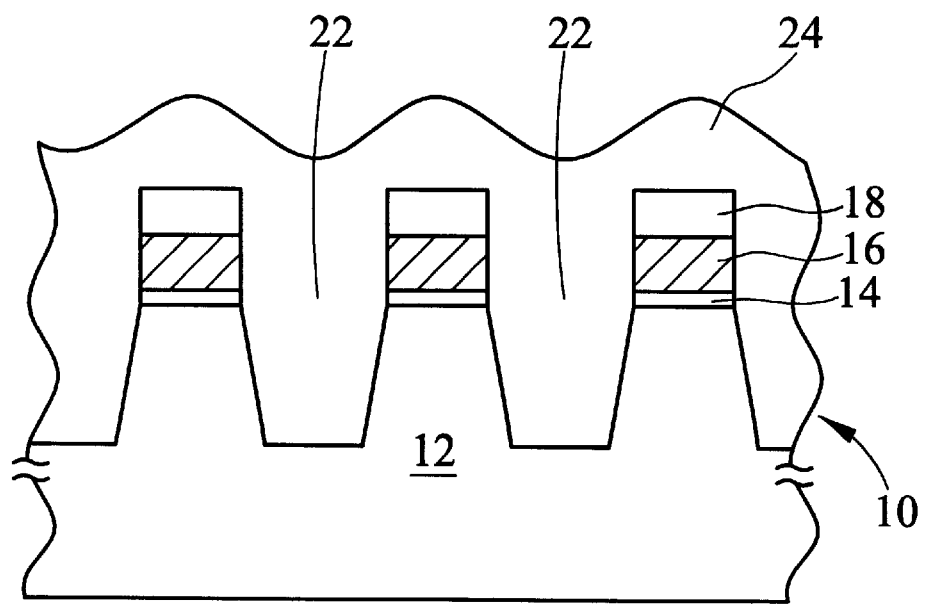
Figure 5:
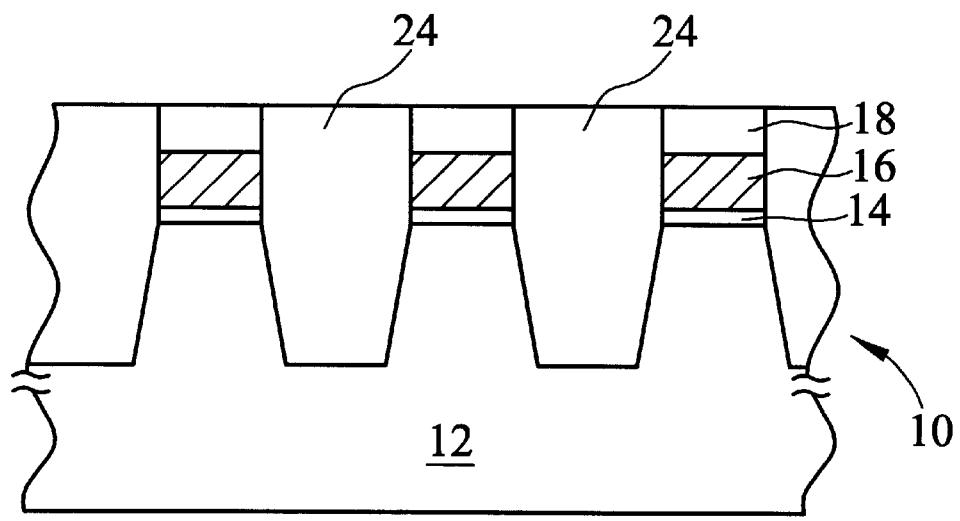
Figure 6:
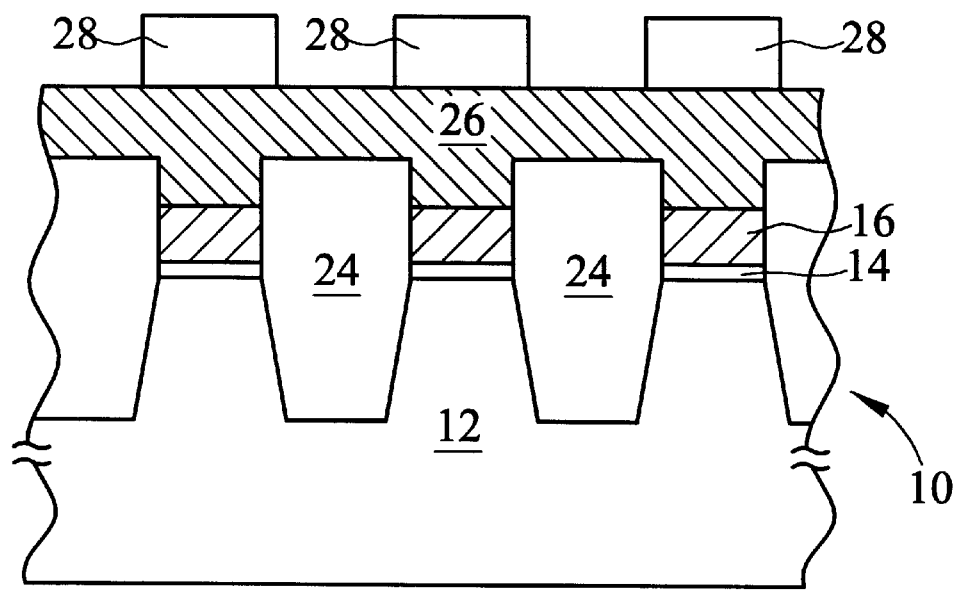
Figure 7:
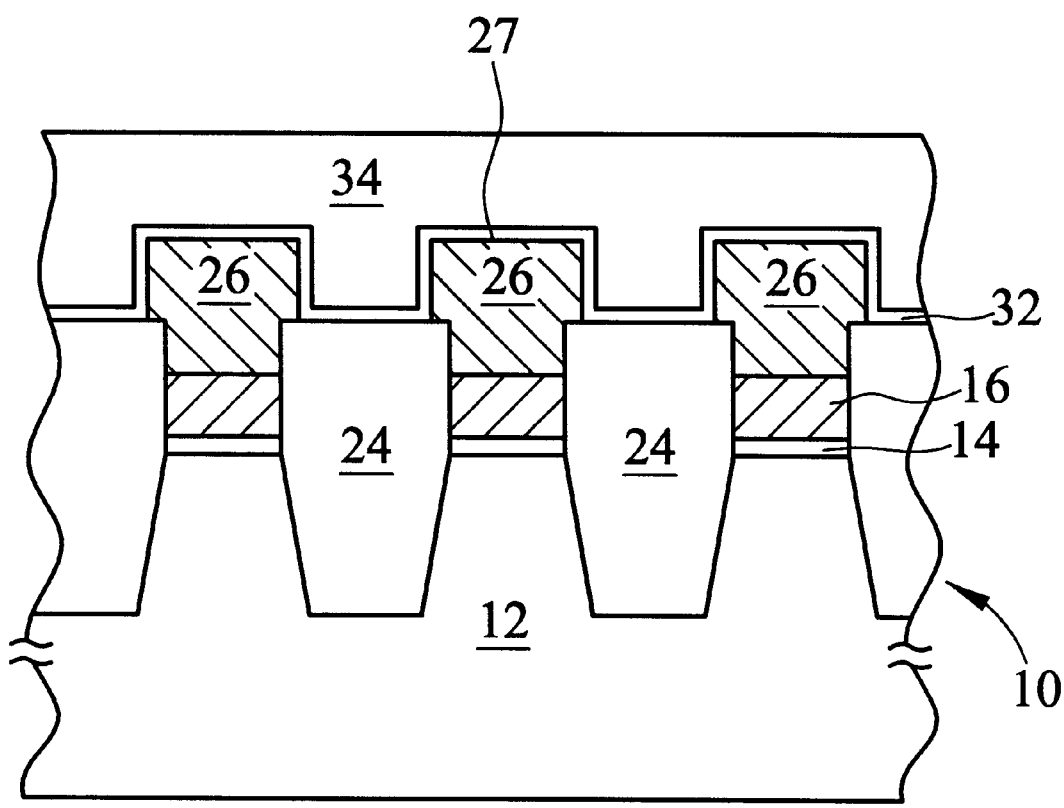
Figure 8:
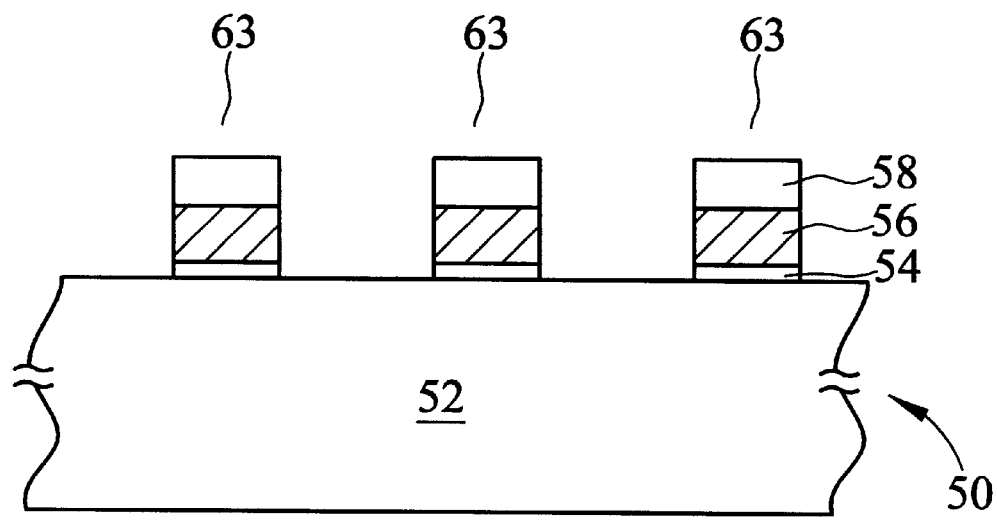
FIG. 8 to FIG. 13 are cross-sectional diagrams of forming a flash memory cell on a semiconductor wafer according to the present invention.

Please refer to FIG. 8 to FIG. 13. FIG. 8 to FIG. 13 are cross-sectional diagrams of forming a flash memory cell on a semiconductor wafer 50 according to the present invention. As shown in FIG. 8, the semiconductor wafer 50 comprises a silicon substrate 52, and a tunneling oxide layer 54 on the silicon substrate 52. The thickness of the tunneling oxide layer 54 is between 40 to 200 angstroms. First, a polysilicon layer with a thickness of about 2000 angstroms (not shown) is deposited on the tunneling oxide layer 54 using a conventional CVD process. Conventional lithographic and etching processes are then used to define a predetermined pattern in the polysilicon layer, i.e. defined polysilicon layer 56. In the preferred embodiment, this predetermined polysilicon pattern is a gate pattern, which defines the channel of a FET of the flash memory cell.

After defining the polysilicon pattern, a defined sacrificial layer 58, which is made of silicon nitride, is formed on the semiconductor wafer 50 by means of conventional CVD process, lithographic and etching processes. The defined sacrificial layer 58 has a thickness of about 1000 to 2000 angstroms and covers the defined polysilicon layer 56 and the tunneling oxide layer 54 within a predetermined region, which defines an active area 63 of the flash memory cell on the semiconductor wafer 50.

Figure 9:
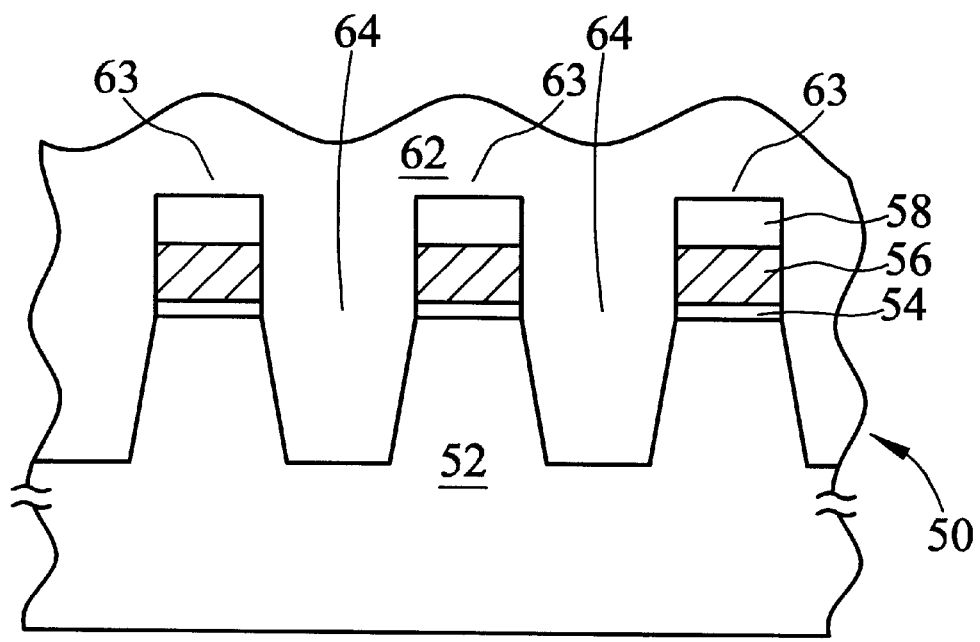

As shown in FIG. 9, after defining the active area or active region 63 of the flash memory cell, the semiconductor wafer 50 is subject to a reactive ion etching (RIE) process. In this RIE process, the silicon substrate 52 is etched using the sacrificial layer 58 as a mask to form a shallow trench isolation (STI) pattern 64 on the silicon substrate 52. Subsequently, an HDPCVD process is performed to deposit an HDP oxide layer 62 on the surface of the semiconductor wafer 50, which fills the STI pattern 64.

Figure 10:
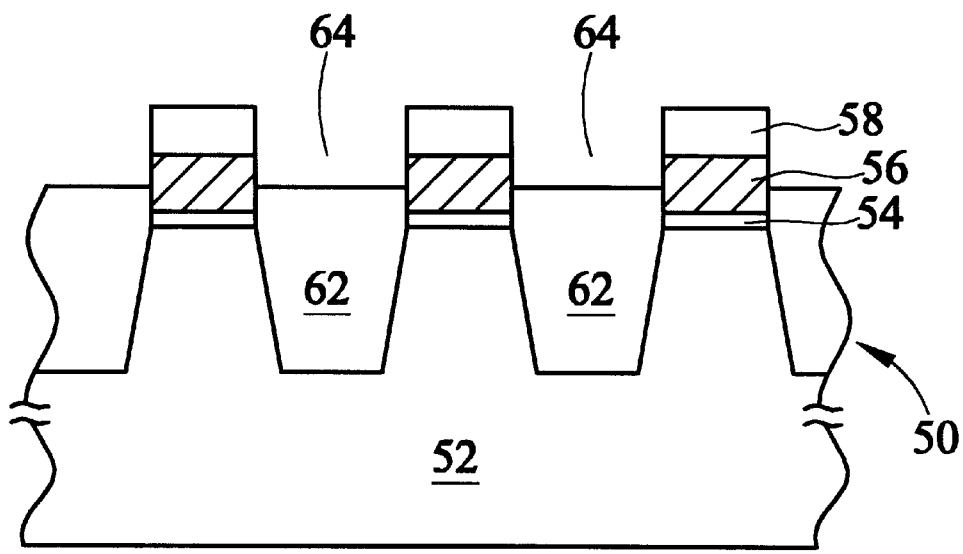

As shown in FIG. 10, a planarization technique, such as a chemical mechanical polishing (CMP) process, is applied to removing the HDP oxide layer 62 over the sacrificial layer 58 using the sacrificial layer 58 as a stop layer to obtain a planar topography. Thereafter, an HDP oxide etch back process is performed to remove a predetermined thickness of the HDP oxide layer 62 that is in the STI pattern 64. In the preferred embodiment, the surface of the remaining HDP oxide layer 62 is approximately flush with a line at half the thickness of the polysilicon layer 56. It should be noted that the predetermined thickness of the removed HDP oxide layer, which is about 2000 to 3500 angstroms in this preferred embodiment, depends upon the combined thickness of the sacrificial layer 58 and the polysilicon layer 56. Furthermore, extreme care must be taken to prevent overetching during this HDP oxide etch back process. The etched surface of the HDP oxide layer 62 must be higher than the bottom of the polysilicon layer 56 to avoid short circuits and failure of the flash memory device.

Figure 11:
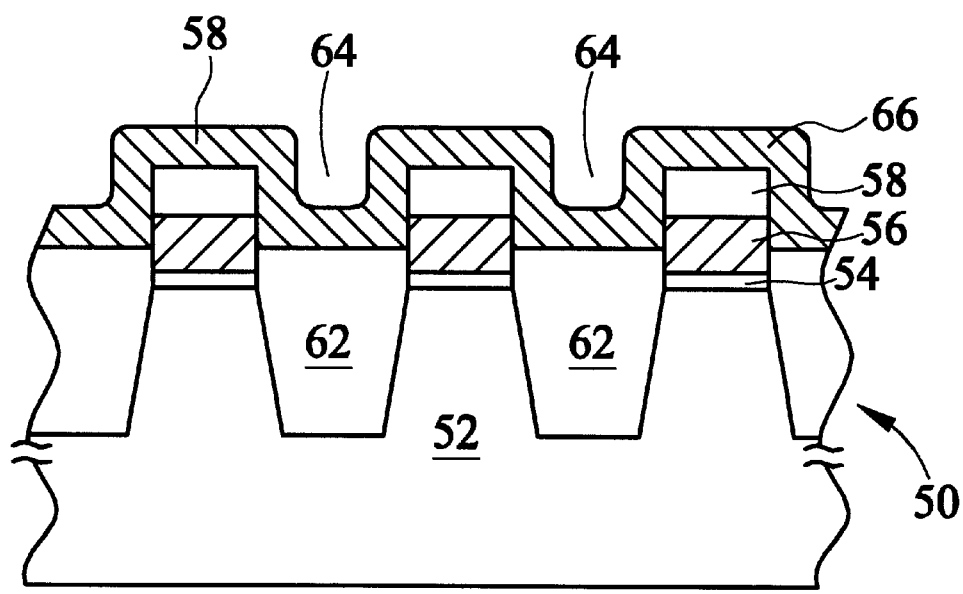
Figure 12:
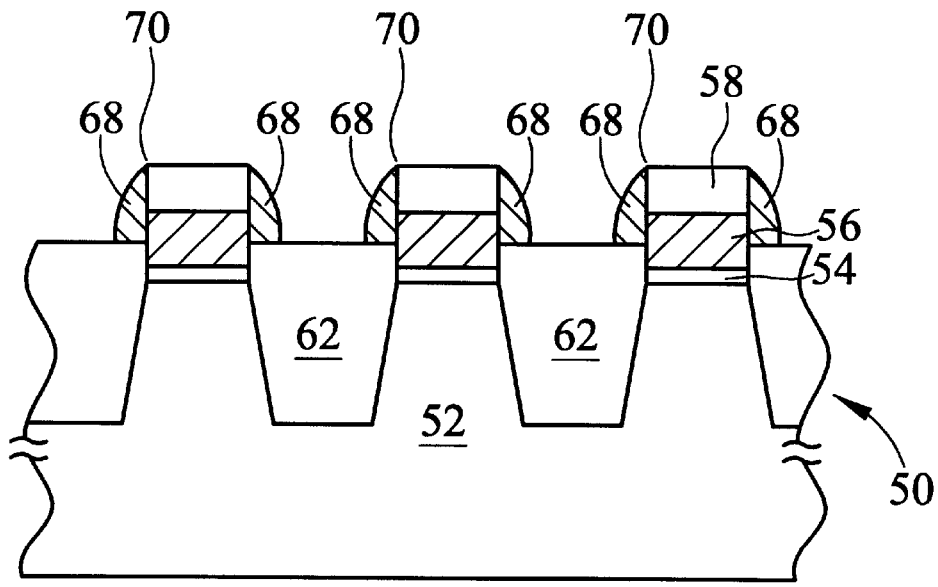

As shown in FIG. 11, a polysilicon layer 66 is deposited on the surface of the semiconductor wafer 50. The thickness of the polysilicon layer 66 is less than the half width of the shallow trench (STI pattern) 64. In the preferred embodiment, the width of the STI pattern is about 0.3 to 0.4 micrometers, and the thickness of the polysilicon layer 66 is about 1000 angstroms. In FIG. 12, a polysilicon etch back process is performed next to remove the polysilicon layer 66 down to the surface of the HDP oxide layer 62. The remaining portions of the polysilicon layer 66 on the exposed vertical walls of the polysilicon layer 56 and sacrificial layer 58 form polysilicon spacers 68. The polysilicon layer 56 and the spacers 68 connecting with the polysilicon layer 56 together form a self-aligned floating gate structure 70.

Figure 13:
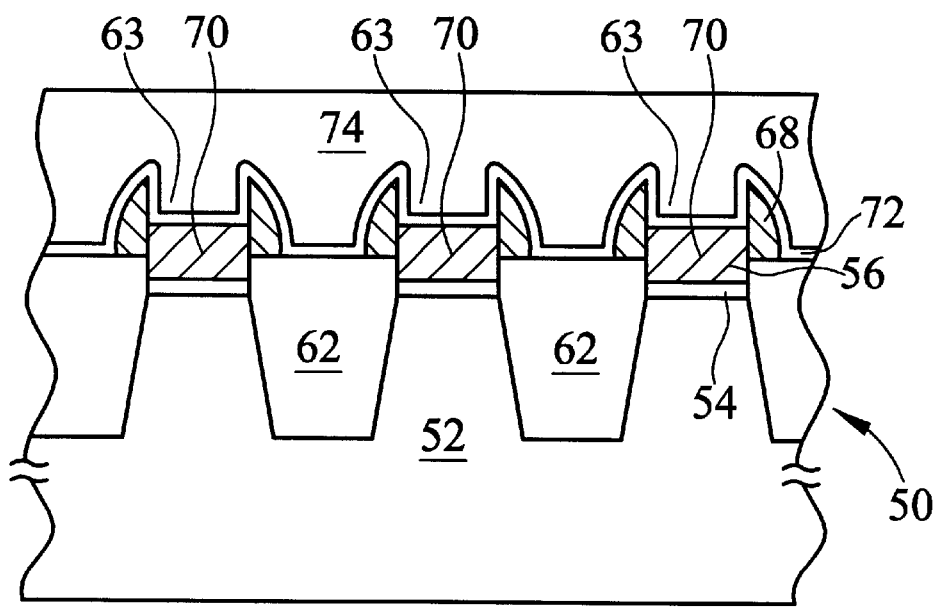

As shown in FIG. 13, the sacrificial layer 58 is completely removed using wet chemistry, such as hot phosphoric acid. A series of LPCVD high-temperature-oxidation (HTO) processes are performed to form a 95 to 175 angstroms thick ONO dielectric layer 72. Over the ONO dielectric layer 72 a patterned control gate 74 composed of doped polysilicon is formed using conventional LPCVD, lithographic and etching processes. Finally, not shown in the figures, an ion implantation process is performed to form a source and drain on the silicon substrate 52 within the active area 63 adjacent to the polysilicon layer 56, thereby completing the manufacture of the flash memory cell.

In another embodiment, another approach for forming the ONO dielectric layer 72 has been practiced. A native oxide layer (not shown) is first formed on the surface of the polysilicon spacer 68 and the polysilicon layer 56 with a thickness of 10 to 50 angstroms. A plasma-enhanced CVD process, or an LPCVD process, is then performed to form a silicon nitride layer (not shown) with a thickness of about 45 angstroms. Finally, a healing process is performed in an oxygen-containing atmosphere at about 800° C. for approximately 30 minutes to form a silicon oxy-nitride layer with a thickness of 40 to 80 angstroms over the silicon nitride layer. The native oxide, the silicon nitride layer and the silicon oxy-nitride layer form the ONO dielectric layer 72.

In contrast to the prior art method, instead of using a lithographic process to define the floating gate, an etch back process is used to form spacers 68 connecting with the polysilicon layer 56 according to this invention. The spacers 68 and the polysilicon layer 56 together form a self-aligned floating gate structure 70 having a greater capacitive surface between the floating gate 70 and the control gate 74, which thus enhances the coupling ratio of the flash memory cell. In addition, the self-aligned floating gate structure 70 avoids misalignments that usually occur in the prior art method due to optical limitations. Consequently, the yield of the flash memory products is significantly improved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a flash memory cell having a self-aligned floating gate structure on a semiconductor wafer, the semiconductor wafer comprising a substrate, a tunneling oxide layer formed on the substrate, a sacrificial layer defining a active region formed over the tunneling oxide layer, and a defined first polysilicon layer formed on the tunneling oxide layer within the active region and covered by the sacrificial layer, the method comprising:

performing an etching process using the sacrificial layer as a mask to form a shallow trench isolation (STI) pattern on the substrate;

forming a dielectric layer on the semiconductor wafer that fills the STI pattern;

performing a planarization process to remove the dielectric layer over the sacrificial layer;

performing a first etch back process to remove a pre-selected thickness of the dielectric layer over the STI pattern;

forming a second polysilicon layer on the semiconductor wafer, the thickness of the second polysilicon layer being less than half width of the shallow trench;

performing a second etch back process to form a spacer connecting with the first polysilicon layer, the spacer and the first polysilicon layer together forming the self-aligned floating gate structure;

removing the sacrificial layer;

forming an insulating layer on the surface of the spacer and the first polysilicon layer;

forming a control gate on the insulating layer; and performing an ion implantation process to form a source and a drain on the substrate within the active region.

2. The method of claim 1 wherein the sacrificial layer is composed of silicon nitride.

3. The method of claim 1 wherein the dielectric layer is composed of silicon dioxide.

4. The method of claim 1 wherein the planarization process is a chemical mechanical polishing (CMP) process.

5. The method of claim 1 wherein the thickness of the first polysilicon layer is about 2000 angstroms and the thickness of the second polysilicon layer is about 1000 angstroms.

6. The method of claim 1 wherein the insulating layer is an ONO (oxidized-silicon nitride-silicon oxide) dielectric layer.

7. The method of claim 1 wherein the control gate is composed of doped polysilicon.

8. The method of claim 1 wherein the self-aligned floating gate structure enhances the coupling ratio of the flash memory cell.

9. A method of fabricating a flash memory cell having a self-aligned floating gate structure on a semiconductor wafer, the semiconductor wafer comprising a silicon substrate, the method comprising:

forming a tunneling oxide layer on the silicon substrate;

forming a first polysilicon layer on the tunneling oxide layer within a first pre-determined region;

forming a sacrificial layer that covers the first polysilicon layer and the tunneling oxide layer on the semiconductor wafer within a second pre-determined region, the second pre-determined region comprising the first pre-determined region;

performing an etching process using the sacrificial layer as a mask to form a shallow trench isolation (STI) pattern on the silicon substrate;

forming a dielectric layer on the semiconductor wafer that fills the STI pattern;

performing a planarization process to remove the dielectric layer over the sacrificial layer;

performing a first etch back process to remove a pre-selected thickness of the dielectric layer over the STI pattern;

forming a second polysilicon layer on the semiconductor wafer, the thickness of the second polysilicon layer being less than half width of the shallow trench;

performing a second etch back process to form a spacer connecting with the first polysilicon layer;

removing the sacrificial layer;

forming an insulating layer on the surface of the spacer and the first polysilicon layer;

forming a control gate on the insulating layer; and performing an ion implantation process to form a source and a drain on the silicon substrate within the second pre-determined region;

wherein the spacer and the first polysilicon layer together form the self-aligned floating gate structure that enhances the coupling ratio of the flash memory cell.

10. The method of claim 9 wherein the thickness of the first polysilicon layer is about 2000 angstroms, and the thickness of the second polysilicon layer is about 1000 angstroms.

11. The method of claim 9 wherein the sacrificial layer is composed of silicon nitride.

12. The method of claim 9 wherein the dielectric layer is composed of silicon dioxide.

13. The method of claim 9 wherein the planarization process is a chemical mechanical polishing (CMP) process.

14. The method of claim 9 wherein the insulating layer is an oxidized-silicon nitride-silicon oxide (ONO) dielectric layer.

15. The method of claim 9 wherein the control gate is composed of doped polysilicon.

* * * * *